United States Patent
Su et al.

(10) Patent No.: US 9,385,178 B2
(45) Date of Patent: Jul. 5, 2016

(54) HIGH VOLTAGE RESISTOR WITH PIN DIODE ISOLATION

(71) Applicant: TAIWAN SEMICONDUCTOR MANUFACTURING COMPANY, LTD., Hsin-Chu (TW)

(72) Inventors: Ru-Yi Su, Kouhu Township (TW); Fu-Chih Yang, Fengshan (TW); Chun Lin Tsai, Hsin-Chu (TW); Chih-Chang Cheng, Hsinchu (TW); Ruey-Hsin Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 107 days.

(21) Appl. No.: 14/179,623

(22) Filed: Feb. 13, 2014

(65) Prior Publication Data

US 2014/0235028 A1    Aug. 21, 2014

Related U.S. Application Data

(62) Division of application No. 13/160,030, filed on Jun. 14, 2011, now Pat. No. 8,664,741.

(51) Int. Cl.
*H01L 29/02*    (2006.01)
*H01L 49/02*    (2006.01)
(Continued)

(52) U.S. Cl.
CPC .............. *H01L 28/20* (2013.01); *H01L 21/761* (2013.01); *H01L 27/0802* (2013.01);
(Continued)

(58) Field of Classification Search
CPC .............. H01L 21/761; H01L 27/0676; H01L 27/0802; H01L 28/20; H01L 29/0692; H01L 29/6609; H01L 29/8605; H01L 29/868
See application file for complete search history.

(56) References Cited

U.S. PATENT DOCUMENTS 4,750,028 A    6/1988    Ludikhuize
5,382,826 A    1/1995    Mojaradi et al.
(Continued)

FOREIGN PATENT DOCUMENTS

TW    233703    6/2005

OTHER PUBLICATIONS

Endo, Koichi, et al., "A 500V 1A 1-Chip Inverter IC With a New Electric Field Reduction Structure", Proc. of the 6$^{th}$ Internat. Symposium on Power Semiconductor Devices & IC's, Davos, Switzerland, May 31-Jun. 2, 1994, IEEE, Cat. No. 94CH3377-9, pp. 379-383.
(Continued)

*Primary Examiner* — Meiya Li
(74) *Attorney, Agent, or Firm* — Haynes and Boone, LLP

(57) ABSTRACT

Provided is a high voltage semiconductor device that includes a PIN diode structure formed in a substrate. The PIN diode includes an intrinsic region located between a first doped well and a second doped well. The first and second doped wells have opposite doping polarities and greater doping concentration levels than the intrinsic region. The semiconductor device includes an insulating structure formed over a portion of the first doped well. The semiconductor device includes an elongate resistor device formed over the insulating structure. The resistor device has first and second portions disposed at opposite ends of the resistor device, respectively. The semiconductor device includes an interconnect structure formed over the resistor device. The interconnect structure includes: a first contact that is electrically coupled to the first doped well and a second contact that is electrically coupled to a third portion of the resistor located between the first and second portions.

20 Claims, 15 Drawing Sheets

(51) Int. Cl.
*H01L 29/66* (2006.01)
*H01L 21/761* (2006.01)
*H01L 27/08* (2006.01)
*H01L 29/8605* (2006.01)
*H01L 29/868* (2006.01)
*H01L 29/06* (2006.01)
*H01L 27/06* (2006.01)

(52) U.S. Cl.
CPC ........ *H01L 29/0692* (2013.01); *H01L 29/6609* (2013.01); *H01L 29/8605* (2013.01); *H01L 29/868* (2013.01); *H01L 27/0676* (2013.01)

(56) References Cited

U.S. PATENT DOCUMENTS

| | | | |
|---|---|---|---|
| 5,585,640 | A | 12/1996 | Huston et al. |
| 6,225,647 | B1 | 5/2001 | Kurtz et al. |
| 6,525,390 | B2 | 2/2003 | Tada et al. |
| 6,677,680 | B2 | 1/2004 | Gates et al. |
| 6,680,515 | B1 | 1/2004 | Hsing |
| 6,770,517 | B2 | 8/2004 | Nakaoka et al. |
| 6,784,077 | B1 | 8/2004 | Lin et al. |
| 6,879,005 | B2 * | 4/2005 | Yamaguchi ......... H01L 29/8611 257/367 |
| 2004/0155317 | A1 | 8/2004 | Bhattacharyya |
| 2004/0227140 | A1 | 11/2004 | Lee et al. |
| 2004/0251499 | A1 | 12/2004 | Yamaguchi et al. |
| 2007/0020840 | A1 | 1/2007 | Chindalore |
| 2008/0142830 | A1 | 6/2008 | Huang et al. |
| 2010/0073076 | A1 | 3/2010 | Fu et al. |
| 2010/0144127 | A1 * | 6/2010 | Nakatsuru ......... H01L 21/02532 438/481 |

OTHER PUBLICATIONS

Unpublished U.S. Appl. No. 12/652,294, "High Voltage Devices and Methods for Forming the High Voltage Devices", filed Jan. 5, 2010, 30 pages.

Ktata, M. Faiez, et al., "When Are Substrate Effects Important for On-Chip Interconnects?", 0-7803-8128-9/03, 2003 IEEE, pp. 265-268.

Unpublished U.S. Appl. No. 13/100,714, "High Voltage Resistor with Biased-Well,", filed May 4, 2008, 26 pages.

Canham, L. T., "Silicon quantum wire array fabrication by electro-chemical and chemical dissolution of wafers," Appl. Phys. Lett., vol. 57, No. 10 (Sep. 3, 1990) pp. 1046-1048.

Liu, C. W., et al., "Hot carrier recombination model of visible electroluminescence from metal-oxide silicon tunneling diodes," Appl. Phys. Lett. vol. 77, No. 26 (Dec. 25, 2000) pp. 4347-4349.

Rebohle, L., et al, "Strong blue and violet photoluminescence and electroluminescence from germanium-implanted and silicon-implanted silicon-dioxide layers," Appl. Phys. Lett., vol. 71, No. 19 (Nov. 10, 1997) pp. 2809-2811.

Shcheglov, K. V., et al., "Electroluminescence and photoluminscence of Ge-implanted Si/SiO2/Si structures," Appl. Phys. Lett., vol. 66, No. 6 (Feb. 6, 1995) pp. 745-747.

Shimizu-lwayama, Tsutomo, et al., "Visible photoluminescence in Si+ implanted silica glass," J. Appl. Phys., vol. 75 No. 12 (Jun. 15, 1994) pp. 7779-7783.

* cited by examiner

HIGH VOLTAGE RESISTOR WITH PIN DIODE ISOLATION

PRIORITY DATA

The present application is a divisional application of U.S. patent application Ser. No. 13/160,030, filed on Jun. 14, 2011, entitled "High Voltage Resistor with Pin Diode Isolation", the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Various types of passive circuit components may be fabricated on a semiconductor wafer. For example, a resistor may be formed as a passive circuit component on a wafer. Some applications require these resistors to withstand high voltages, for example voltages as high as a few hundred volts. However, conventional high voltage resistors may suffer from device breakdown issues before a sufficiently-high voltage is reached. For example, conventional high voltage resistors may rely on using a P/N junction to sustain a breakdown voltage. Junction breakdown is limited by doping concentration, which has not been optimized in conventional high voltage resistors.

Therefore, while existing high voltage resistor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
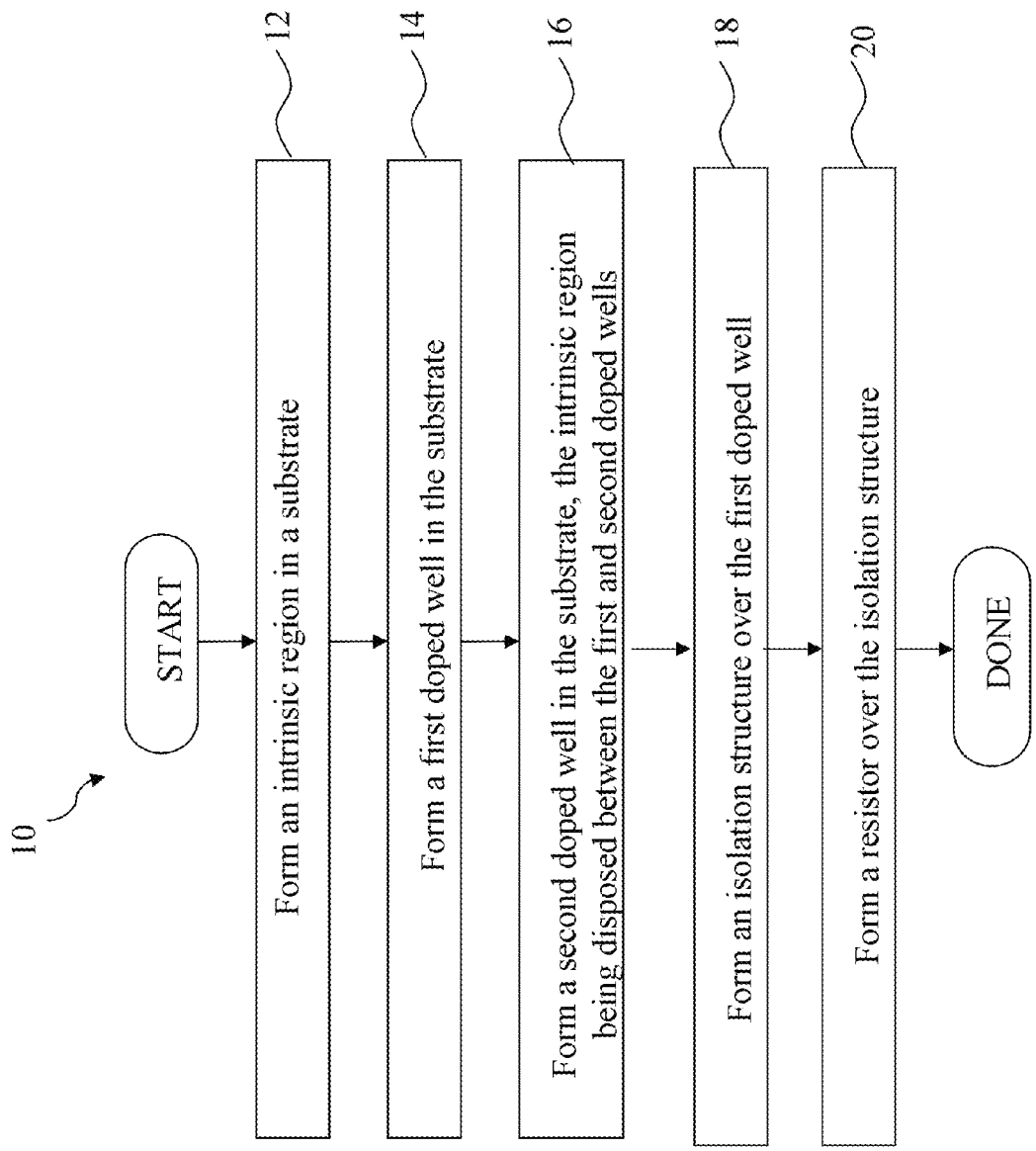
FIG. 1 is a flowchart illustrating a method for fabricating a high voltage semiconductor device according to various aspects of the present disclosure.

Illustrated in FIG. 1 is a flowchart of a method 10 according to various aspects of the present disclosure. The method 10 begins with block 12 in which an intrinsic region is formed in a substrate. The method 10 continues with block 14 in which a first doped well is formed in the substrate, the first doped region being formed adjacent to the intrinsic region and having a higher doping concentration level than the intrinsic region. The method 10 continues with block 16 in which a second doped well is formed in the substrate, the second well being oppositely doped from the first doped well and having a higher doping concentration level than the intrinsic region, wherein the intrinsic region is disposed between the first and second doped wells. The method 10 continues with block 18 in which an isolation structure is formed over the first doped well. The method 10 continues with block 20 in which a resistor is formed over the isolation structure.

FIGS. 2-8 are diagrammatic fragmentary cross-sectional side views of various portions of a semiconductor wafer at various fabrication stages according to embodiments of the present disclosure. It is understood that FIGS. 2 to 8 have been simplified for a better understanding of the inventive concepts of the present disclosure.

Figure 2:
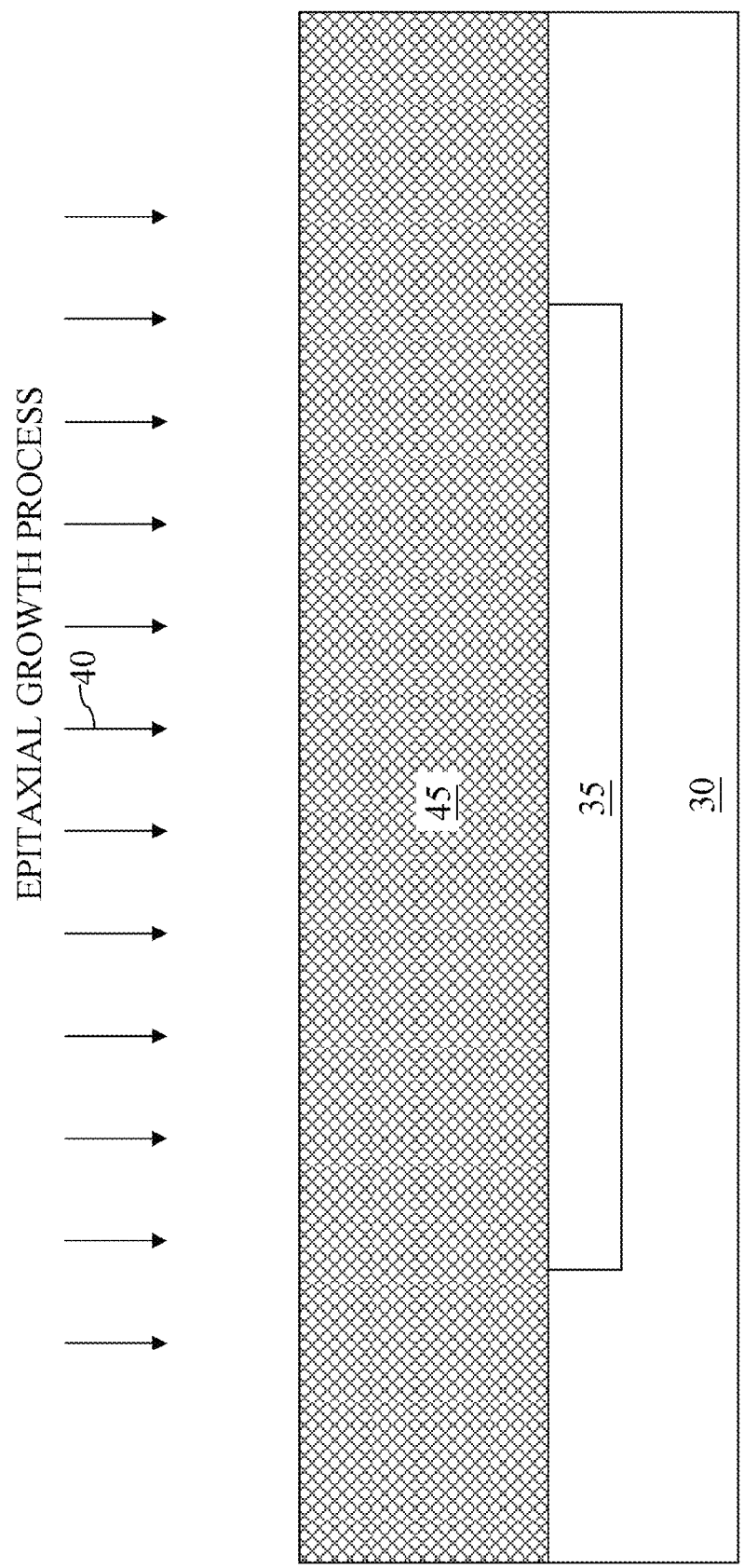
FIGS. 2-8 are diagrammatic fragmentary cross-sectional side views of a portion of a wafer at various stages of fabrication in accordance with various aspects of the present disclosure.

Referring to FIG. 2, a portion of a substrate 30 is illustrated. The substrate 30 is doped with a P-type dopant such as boron. In another embodiment, the substrate 30 may be doped with an N-type dopant such as phosphorous or arsenic. The substrate 30 may also include other suitable elementary semiconductor materials, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

A buried well 35 is formed in a portion of the substrate 30 through an ion implantation process known in the art. The buried N-wells may be formed by an implantation process having a dose that is in a range from about $1\times10^{12}$ atoms/centimeter$^2$ to about $2\times10^{12}$ atoms/centimeter$^2$. It is understood that a patterned photoresist layer may be formed over an upper surface of the substrate before the implantation process is performed. The patterned photoresist layer serves as a mask during the implantation process. The buried well 35 is formed to have an opposite doping polarity to that of the substrate 30. In the illustrated embodiment, the buried well 35 is N-type doped, since the substrate 30 is a P-type substrate. In another embodiment where the substrate 30 is an N-type substrate, the buried well 35 is P-type doped.

An epitaxial growth process 40 is performed to form an epi-layer 45 over the substrate 30 and over the buried well 35. The epi-layer 45 may be N-type doped in one embodiment, and may be P-type doped in another embodiment. The epi-layer 45 has a light or low doping concentration level. In an embodiment, the epi-layer 45 has a doping concentration level that is in a range from about $5 \times 10^{13}$ atoms/centimeter$^3$ to about $5 \times 10^{15}$ atoms/centimeter$^3$. In an embodiment, the epitaxial growth process 40 is an N-type epitaxial process, and the resulting epi-layer 45 has a resistivity that is about 45 ohm-centimeter.

Figure 3:
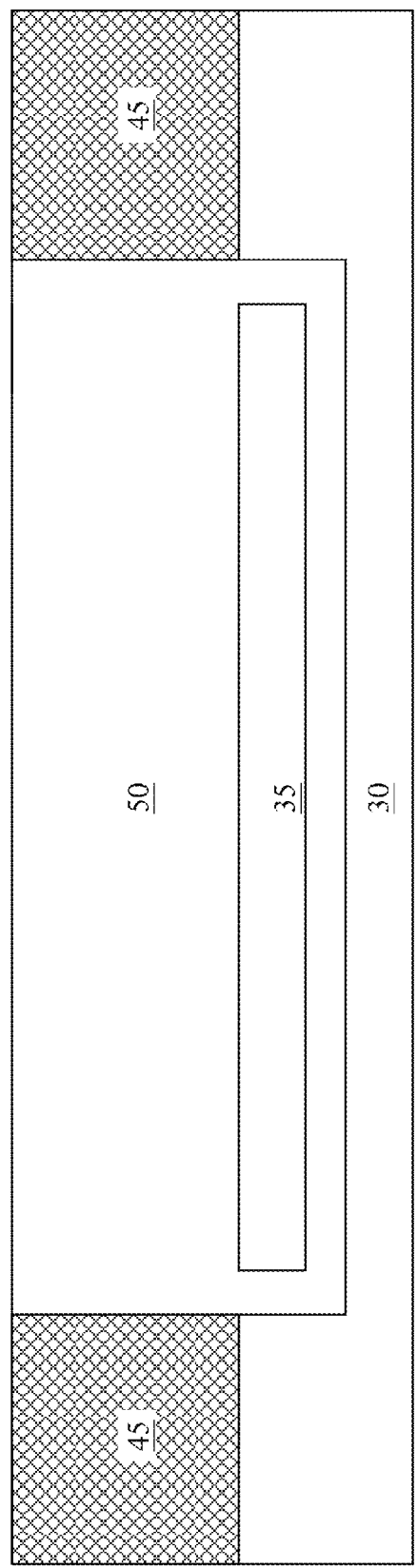

Referring now to FIG. 3, a high-voltage doped well 50 is formed in the substrate 30. The high-voltage doped well 50 is formed by an ion implantation process known in the art. For example, the high-voltage doped well 50 may be formed by an implantation process having a dose that is in a range from about $3 \times 10^{12}$ atoms/centimeter$^2$ to about $4 \times 10^{12}$ atoms/centimeter$^2$. A patterned photoresist layer (not illustrated) may be formed over the substrate 35 as a mask during the implantation process. The high-voltage doped well 50 is doped with the same doping polarity as the buried well 35 (opposite from that of the substrate 30). Also, the high-voltage doped well 50 is formed in a manner such that it surrounds the buried well 35. It is understood that in some embodiments, the buried well 35 may be considered to be a part of the high-voltage doped well 50, or that they collectively form an N-type doped region.

Figure 4:
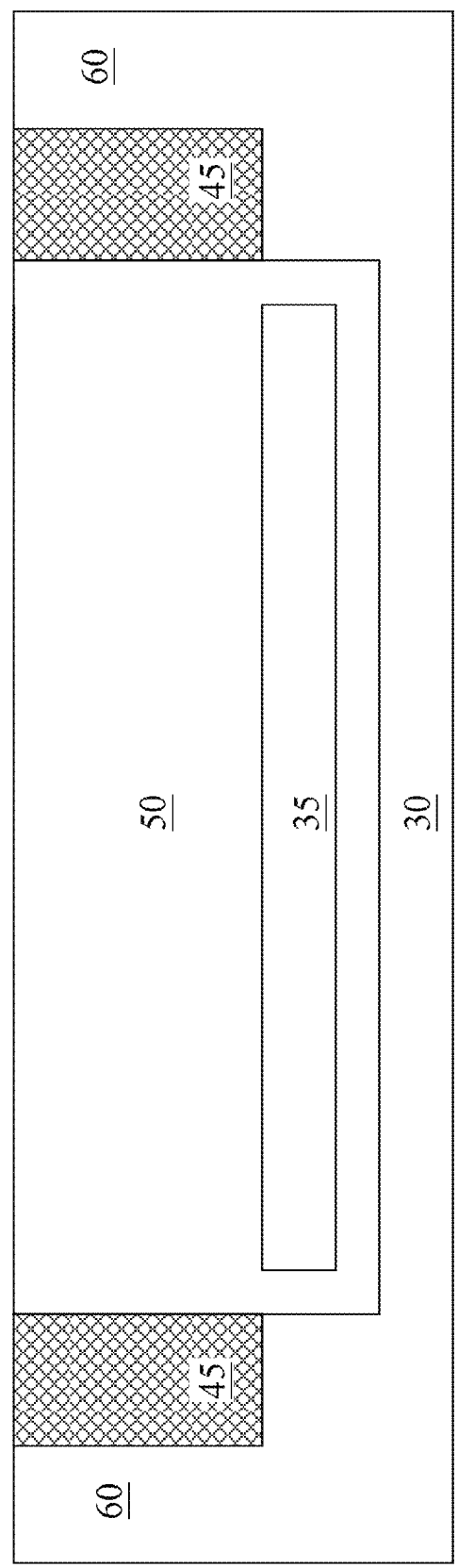

Referring now to FIG. 4, doped wells 60 are formed in the substrate. The doped wells 60 are doped with the same doping polarity as that of the substrate 30. Thus, in the embodiment shown, the doped wells 60 are formed to be P-wells. After the formation of the doped wells 60, the epi-layer 45 is now divided into segments 45, which may also be referred to as epi-regions. Each epi-region 45 is disposed between the high-voltage doped well 50 (N-type in the illustrated embodiment) and the doped well 60 (P-type in the illustrated embodiment).

A PIN diode is formed by the high-voltage doped well 50, the epi-region 45, and the doped well 60. A PIN diode is a diode with a lightly-doped intrinsic region disposed between a P-type region and an N-type region. The P-type and N-type regions are typically heavily doped because they may be used for ohmic contacts. The lightly-doped intrinsic region makes the PIN diode more suitable for high voltage applications, which will be discussed later in more detail. In the illustrated embodiment, the epi-region 45 has a lower doping concentration level than both the high-voltage doped well 50 and the doped well 60. Therefore, the high-voltage doped well 50 serves as the heavily doped N-type region, the doped well 60 serves as the heavily doped P-type region, and the epi-region 45 serves as the lightly-doped intrinsic region of a PIN diode.

Figure 5:
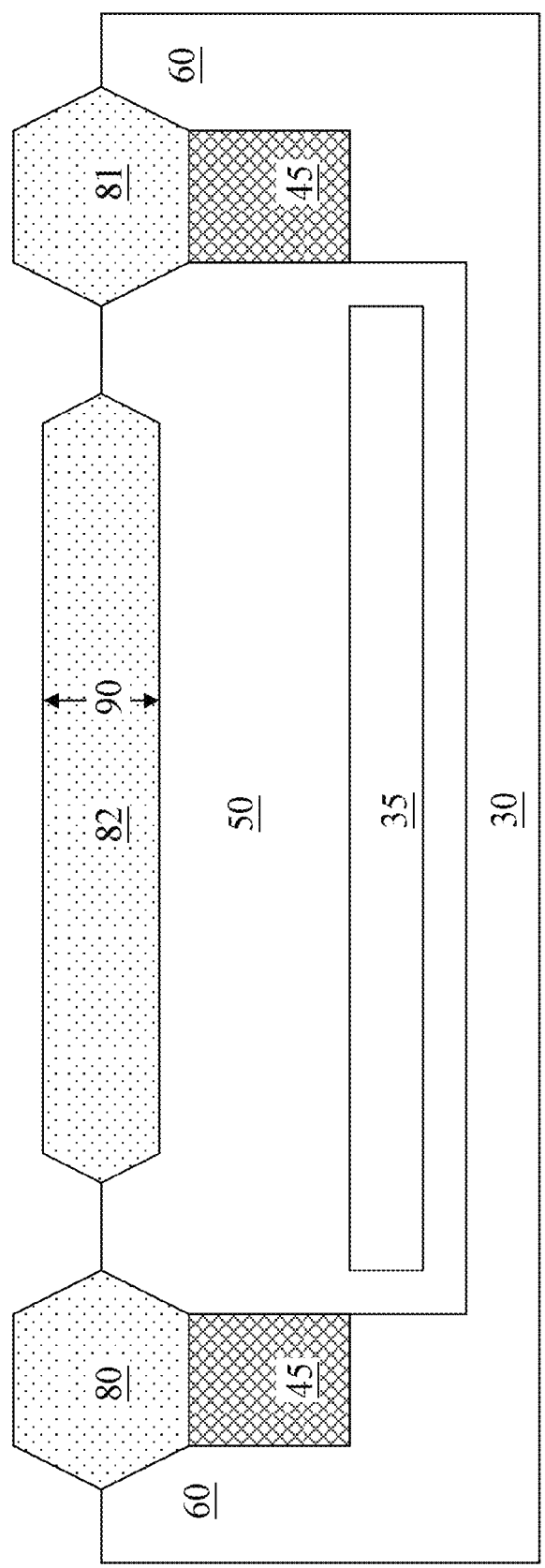

Referring now to FIG. 5, isolation structures 80-81 are formed over the epi-regions 45, and an isolation structure 82 is formed over the high-voltage doped well 50. The isolation structures 80-82 may include a dielectric material. The isolation structure 82 has a thickness 90. In an embodiment, the thickness 90 is in a range from about 0.2 microns (um) to about 1 um. In the embodiment shown in FIG. 5, the isolation structures 80-82 are Local Oxidation of Silicon (LOCOS) devices (also referred to as field oxide). The LOCOS devices may be formed using a nitride mask and thermal-growing an oxide material through the mask openings. Alternatively, the isolation structures 80-82 may include shallow trench isolation (STI) devices or deep trench isolation (DTI) devices.

Thereafter, active regions of transistors are defined, and transistor devices (not shown) are formed. For example, these transistor devices may be Field Effect Transistor (FET) devices and may include source/drain regions and gate structures. The source/drain regions may be doped regions formed in the substrate 30 or in a doped well, and the gate structures may include either polysilicon gate structures or metal gate structures. These gate structures may be referred to as low-voltage (LV) gate structures, as they are designed to handle voltages as high as a few volts.

Figure 6:
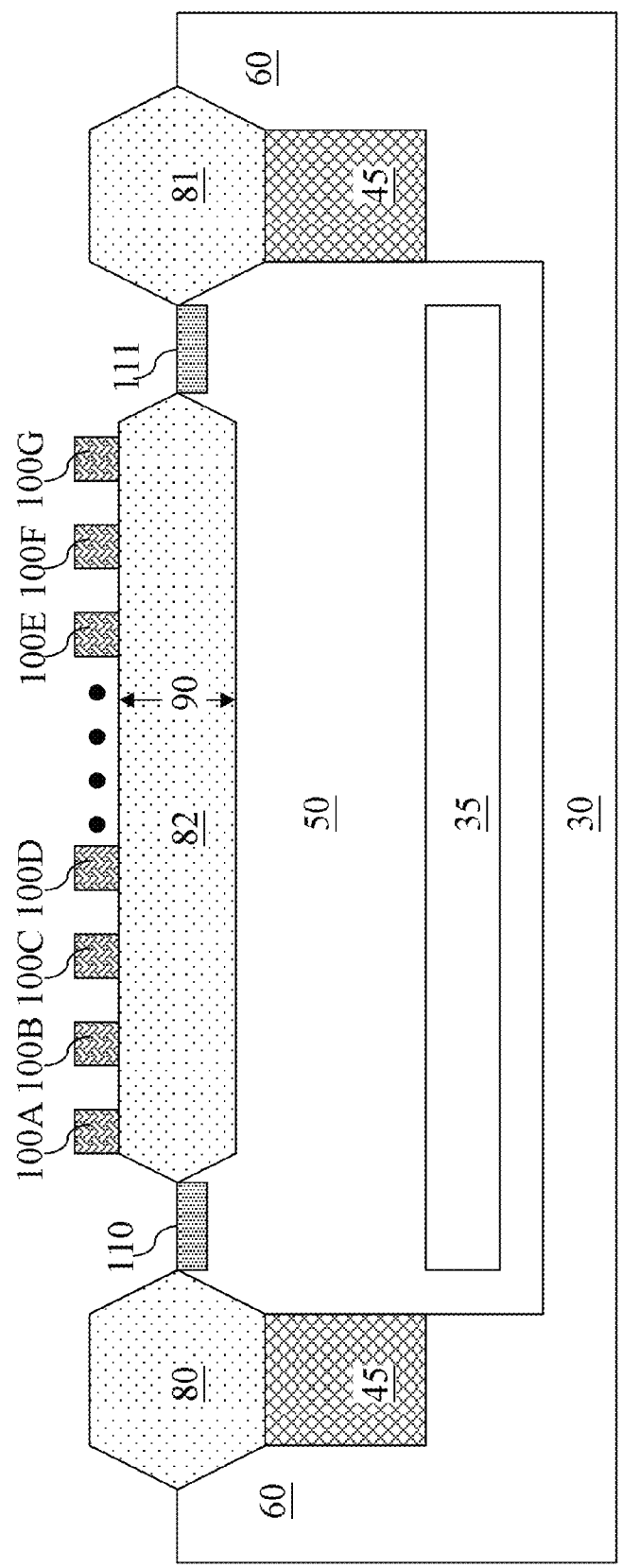

Referring now to FIG. 6, a resistor device 100 is formed over the isolation structure 82. The resistor device 100 has an elongate and winding shape. In one embodiment, the resistor device 100 has a zig-zag (or an S shape). In another embodiment, the resistor device 100 has a spiral shape. In yet another embodiment, the resistor device 100 has a square shape. These shapes will be more clearly viewed with reference to FIGS. 10-13 below, which illustrate top views of various embodiments of the resistor device 100. In the cross-sectional view shown in FIG. 6, the resistor device 100 appears as a plurality of resistor blocks 100A-100G. It is understood, however, that these resistor blocks 100A-100G are actually parts of an individual elongate resistor device.

In an embodiment, the resistor device 100 includes a polysilicon material, and may therefore be referred to as a polysilicon resistor. The polysilicon resistor 100 is designed to handle high voltages, for example voltages greater than about 100 volts, and may be as high as a few hundred volts. Thus, the polysilicon resistor 100 may also be referred to as a high voltage device. In that case, the polysilicon resistor 100 may be formed at the same time as when other high voltage polysilicon gates are formed. In other words, the polysilicon resistor 100 may be formed using the same processes that form other high voltage polysilicon gates.

Thereafter, heavily doped regions 110-111 are formed at the upper surface of the high-voltage doped well 50 and adjacent the isolation structure 82. In the embodiment shown, the heavily doped regions 110-111 are formed in between the isolation structures 80-82 and 81-82, respectively. The heavily doped regions 110-111 may be formed by one or more ion implantation processes. The heavily doped regions 110-111 have the same doping polarity (in this case N-type) as the high-voltage doped well 50, but with a higher doping concentration. The heavily doped regions 110-111 have a doping concentration level that is in a range from about $1 \times 10^{19}$ atoms/centimeter$^3$ to about $1 \times 10^{20}$ atoms/centimeter$^3$.

Figure 7:
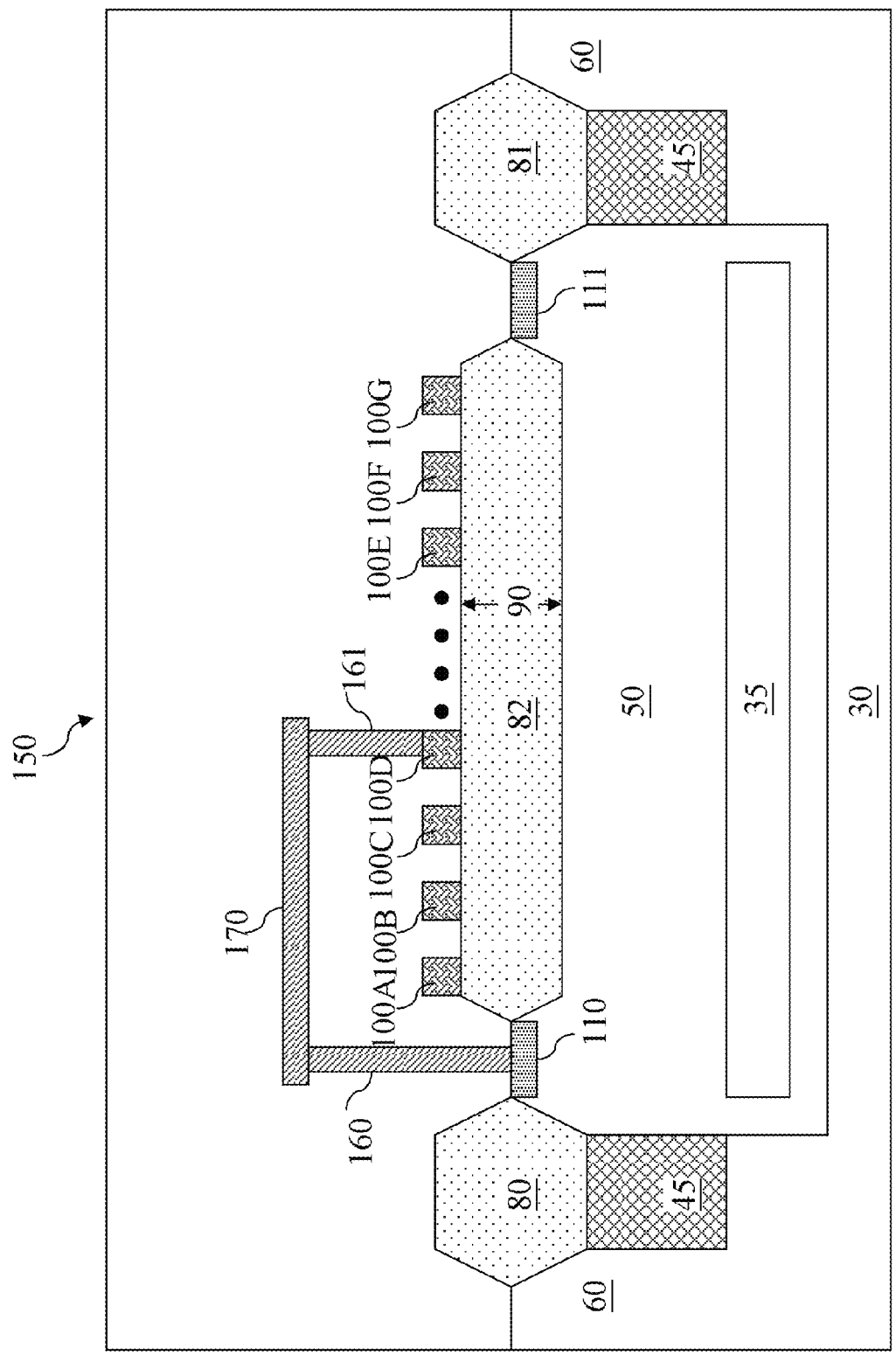

Referring now to FIG. 7, an interconnect structure 150 is formed over the isolation structures 80-82, the heavily doped regions 110-111, and the resistor device 100. The interconnect structure 150 includes a plurality of patterned dielectric layers and conductive layers that provide interconnections (e.g., wiring) between circuitries, inputs/outputs, and various doped features (for example, the high-voltage doped well 50). In more detail, the interconnect structure 150 may include a plurality of interconnect layers, also referred to as metal layers. Each of the interconnect layers includes a plurality of interconnect features, also referred to as metal lines. The metal lines may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The metal lines may be formed by a process including physical vapor deposition (PVD), chemical vapor deposition (CVD), sputtering, plating, or combinations thereof.

The interconnect structure 150 includes an interlayer dielectric (ILD) that provides isolation between the interconnect layers. The ILD may include a dielectric material such as a low-k material or an oxide material. The interconnect structure 150 also includes a plurality of contacts/contacts that provide electrical connections between the different interconnect layers and/or the features on the substrate, such as the high-voltage doped well 50 or the resistor device 100.

As part of the interconnect structure, a contact 160 is formed on the heavily doped region 110. As such, the contact 160 is electrically coupled to the heavily doped region 110 and therefore electrically coupled to the high-voltage doped well 50. An electrical bias can be applied to the high-voltage doped well 50 through the contact 160. Meanwhile, another contact 161 is formed on a segment 100D of the resistor device. The segment 100D is located between two opposite distal ends of the resistor device 100 (e.g., 100A and 100G), and it is located at or near a midpoint of the resistor device 100.

The midpoint of the resistor device is a point on the resistor device that is equidistant from the two opposite distal ends. As an example, if the resistor device 100 has a total length L that is measured along all the windings or turns of the resistor device, then the midpoint of the resistor device 100 is a point that is 0.5*L away from either of the two distal ends. Resistance of a device is a function of the device's length, width, height, and material. Thus, in an embodiment where the resistor device 100 has a relatively uniform width, height, and material composition throughout, the resistance of the portion of the resistor device on either side of the midpoint is 0.5*(overall resistance of the resistor device). According to Kirchhoff's law, voltage=current*resistance. Thus, as current remains fixed, voltage varies linearly with resistance. This means that a voltage at the midpoint of the resistor device is about $0.5*(V_{High}-V_{low})$, wherein $V_{High}$ is defined as the high voltage at one of the distal ends, and $V_{low}$ is defined as the low voltage at one of the distal ends (which is typically electrically grounded).

In the present embodiment, the segment 100D (coupled to the contact 161) is within 0.1*L of the midpoint of the resistor device 100, where L=overall length of the resistor device. Stated differently, the segment may be at, or no farther than, 0.1*L away from the midpoint. Another way of expressing this relationship is that a distance between the segment 100D and either the distal end 100A or the distal end 100G is in a range from about 0.4*L to about 0.6*L.

The interconnect structure 150 includes a metal line (or interconnect line) 170 that is electrically coupled to both the contact 160 and the contact 161. In this manner, the high-voltage doped well 50 is electrically biased to the same voltage as the segment 100D of the resistor device. In other words, the voltage at the segmented 100D—which will be a percentage of the voltage applied to one of the distal ends of the resistor device 100—will be the voltage at the high-voltage doped well 50. This type of biasing scheme offers advantages, which will be discussed below in more detail.

Figure 8:
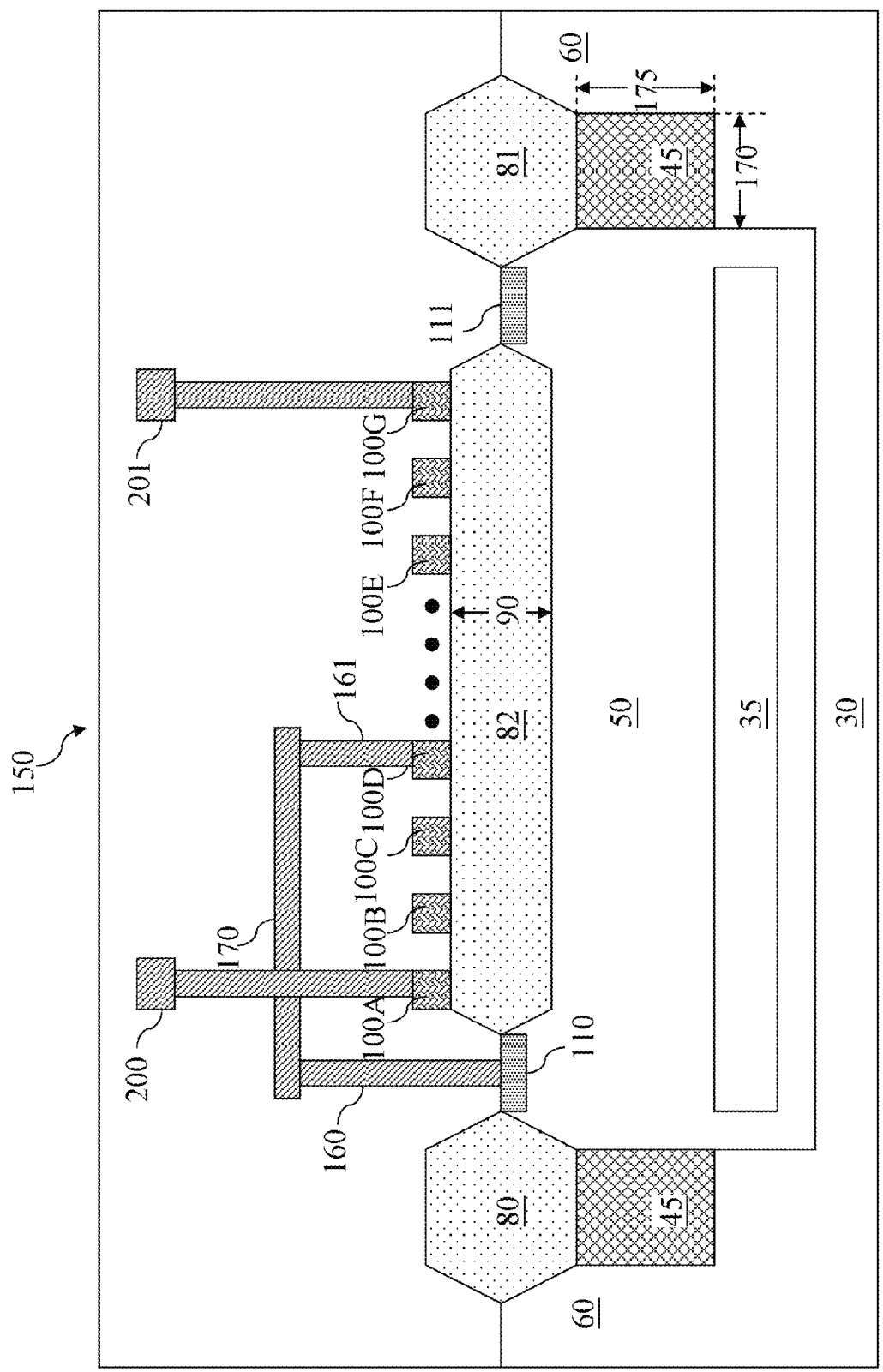

Referring now to FIG. 8, the distal end 100A of the resistor device is coupled to a terminal 200, and the distal end 100G of the resistor device is coupled to a terminal 201. The terminals 200 and 201 include conductive materials such as Al or Cu, or combinations thereof. The terminals 200 and 201 may be electrically coupled to the distal ends 100A and 100G through one or more respective contacts/contacts and/or metal lines, which are not necessarily illustrated in detail herein for the sake of simplicity. The terminals 200-201 also may or may not be formed directly over the resistor device 100.

The terminals 200 and 201 serve as electrical input/output points (or access points) for the resistor device 100. For example, a high voltage (on the order of a few hundred volts) can be applied to the terminal 200 while the terminal 201 can be grounded. Vice versa, a high voltage can be applied to the terminal 201 while the terminal 200 can be grounded.

As discussed above, the segment 100D experiences only a fraction of the high voltage applied at either the terminal 200 or the terminal 201. As an example, in an embodiment where a voltage of about 500 volts is applied to the terminal 201 and the terminal 200 is grounded, and where the segment 100D is located substantially at the midpoint of the resistor device 100, then the voltage at the segment 100D will be about 250 volts. As the location of segment 100D moves away from the midpoint and toward either the distal ends 100A or 100G, the voltage measured at the segment 100D will also drift away from 250 volts.

In an embodiment where $V_{High}$ is applied at one of the terminals 200-201, and the other one of the terminals is grounded, and the location of segment 100D is within 0.1*L away from the midpoint of the resistor device, then the voltage at the segment 100D will be in a range from about $0.4*V_{High}$ to about $0.6*V_{High}$, for example at about $0.5*V_{High}$. Since the heavily doped region 110 (and therefore the high-voltage doped well 50) is tied to segment 100D, this means the high-voltage doped well 50 is electrically biased to the voltage at segment 100D. In other words, the high-voltage doped well 50 is electrically biased close to a middle of the voltage difference between the two terminals 200-201, which is not done in conventional high voltage devices. Thus, for conventional high voltage devices, a high voltage potential exists between the HVNW and one of the distal ends of the resistor device. The device may suffer breakdown issues caused by such high voltage potential. The device breakdown is typically limited by the thickness 90 of the isolation structure 82. Typically, the conventional high voltage devices may experience device breakdown issues when $V_{High}$ exceeds about 470 volts.

In comparison, the embodiments herein electrically bias the high-voltage doped well 50 to have a voltage that is close to a middle of the voltage difference between the two terminals 200-201. As such, the device can tolerate a higher voltage difference before breakdown occurs, since the voltage at the high-voltage doped well 50 is not too different from either $V_{High}$ or $V_{Low}$. As an example, the device herein can tolerate a voltage difference of about 730 volts in an embodiment, as the high-voltage doped well 50 is biased to about half of 730 volts, which is about 365 volts. Stated differently, the device only needs to tolerate about 365 volts to enable a high voltage of about 730 volts to be applied to one of its terminals (the other terminal is grounded). Meanwhile, the thickness 90 of the isolation structure can remain about the same as conventional devices, since the embodiments herein need not rely on increase in thickness of the isolation structure 82 to improve its tolerance of high voltages. Additionally, the biased high-voltage doped well 50 may also extend a depletion region in the substrate 30, which may further improve the device's electrical performance.

The PIN diodes formed herein by the high-voltage doped well 50, the epi-regions 45, and the doped well 60 also help increase the breakdown voltage of the resistor device 100. In conventional high-voltage structures without the lightly-doped intrinsic regions (e.g., the epi-regions 45), a high electric field is concentrated near a P/N junction formed at a P-well and a high-voltage N-well. This concentrated electric field may have a triangular shape and may cause device breakdown at voltages less than about 100 volts. In comparison, by inserting the epi-regions 45, the high voltage device of the present disclosure may change the shape of the electric field to a more trapezoidal shape. Breakdown voltage is an integral over the area of the electric field. Due at least in part to its larger area, the trapezoidal-shaped electric field herein will yield a larger integral than traditional triangular-shaped electric fields. As such, the breakdown voltage is increased.

The epi-region 45 has a width 170 (lateral dimension, measured horizontally in the illustrated embodiment) and a height 175 (or depth, measured vertically in the illustrated embodiment). In an embodiment, the width 170 is in a range from about 5 um to about 100 um, and the height 175 is in a range from about 2 um to about 6 um. The level of breakdown voltage is a function of the width 170 of the epi-region 45.

Figure 9:
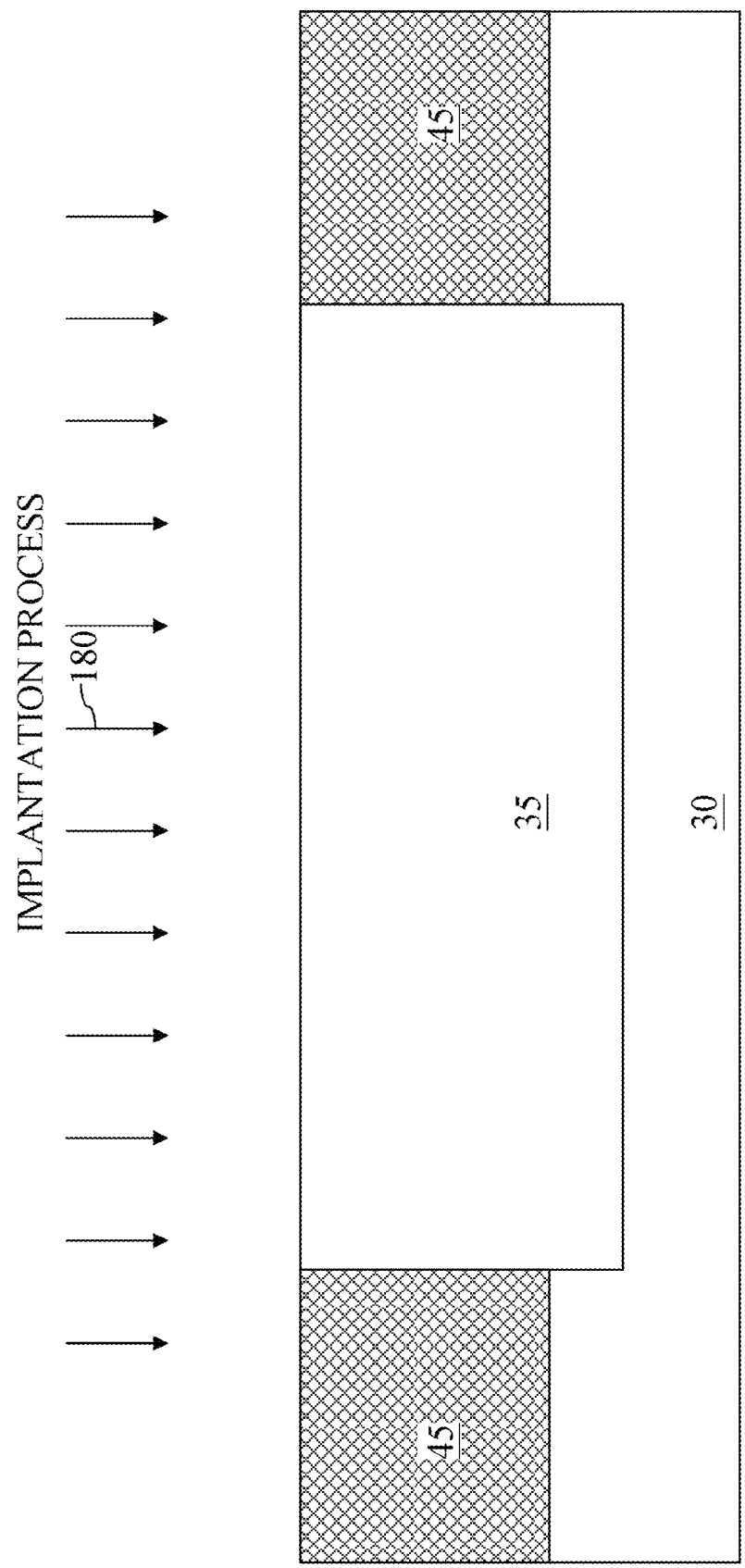
FIG. 9 is a diagrammatic fragmentary cross-sectional side views of a portion of a wafer at a stage of fabrication in accordance with an alternative embodiment of the present disclosure.

Although the embodiment discussed above utilizes epi-regions 45 as the lightly-doped intrinsic regions of PIN diodes, other devices or methods may be used to form the intrinsic regions as well. For example, referring to FIG. 9, a diagrammatic fragmentary cross-sectional side view of an alternative embodiment is illustrated. According to the alternative embodiment, after the buried well 35 is formed, an ion implantation process 180 is performed to form lightly-doped regions 45 in the substrate 30. A patterned photoresist layer (not illustrated) may be formed as an implantation mask. The lightly-doped regions 45 are formed adjacent to the buried well 35 in an embodiment. The lightly-doped regions 45 may have either an N-type doping polarity or a P-type doping polarity. In an embodiment, the doping concentration level of the lightly-doped regions is in a range from about $5\times10^{13}$ atoms/centimeter$^3$ to about $5\times10^{15}$ atoms/centimeter$^3$. The implantation process 180 may be N-type doped in one embodiment, and may be P-type doped in another embodiment. The implant-layer 180 has a light or low doping concentration level. In an embodiment, the implant-layer 180 has a doping concentration level that is in a range from about $5\times10^{13}$ atoms/centimeter$^3$ to about $5\times10^{15}$ atoms/centimeter$^3$.

Thereafter, the same processes discussed above may be used to complete the fabrication of the high voltage device. For example, these additional processes may include high voltage N-well formation, P-well formation, isolation structure formation, resistor formation, etc. For the sake of simplicity, the discussion of these processes is not repeated. It is also understood that additional fabrication processes may be performed to complete the fabrication of the semiconductor device shown in FIGS. 2-9. For example, the semiconductor device may undergo passivation, wafer acceptance testing, and wafer dicing processes. For the sake of simplicity, these additional processes are not shown or discussed herein either.

Figure 10:
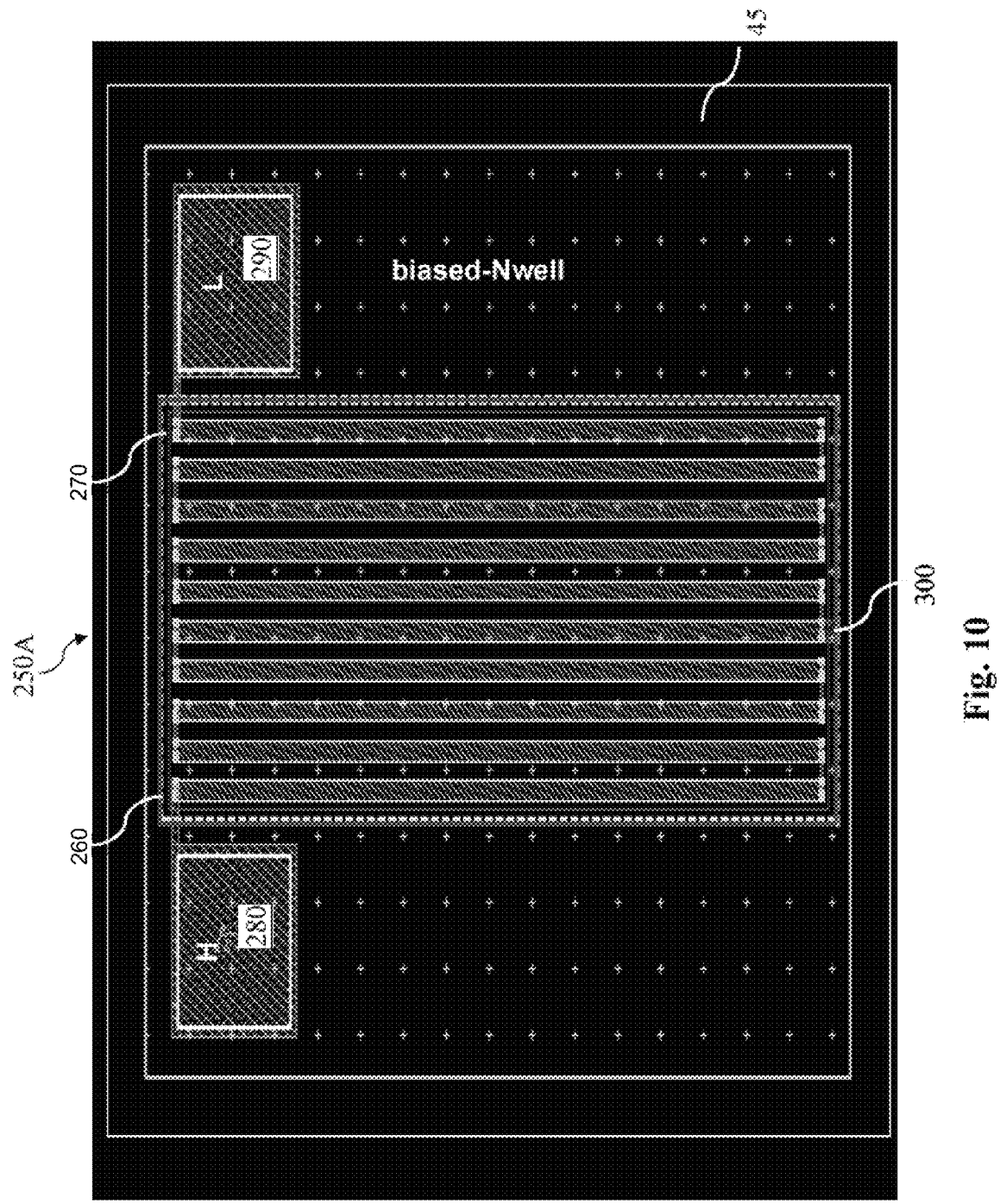
FIGS. 10-13 are simplified top views of different embodiments of a high voltage resistor according to various aspects of the present disclosure, respectively.

Referring now to FIG. 10, a simplified top view of an embodiment of a resistor device 250A is illustrated. The resistor device 250A is formed according to various aspects of the present disclosure discussed above. In this embodiment, the resistor device 250A has an elongated zig-zag shape, or an S-shape. The resistor device 250A has two opposite distal ends 260 and 270. The distal ends 260 and 270 are electrically coupled to terminals 280 and 290, respectively. A high voltage may be applied to the terminal 280 while the terminal 290 is grounded, or vice versa. Thus, a high voltage potential exists across the resistor device 250A through the terminals 280 and 290. The resistor device 250A has a midpoint 300 that is equidistant (in terms of distance along the resistor 250A, rather than absolute distance between two points) from the two distal ends 260 and 270. According to the various aspects of the present disclosure, a high voltage N-well underneath the resistor device 250A may be electrically coupled to the midpoint 300, or close to it (for example within 10% of the total length of the resistor device 250A). As discussed above, such configuration allows the resistor device 250A to have better breakdown performance—it can tolerate a higher voltage before breakdown occurs.

Figure 11:
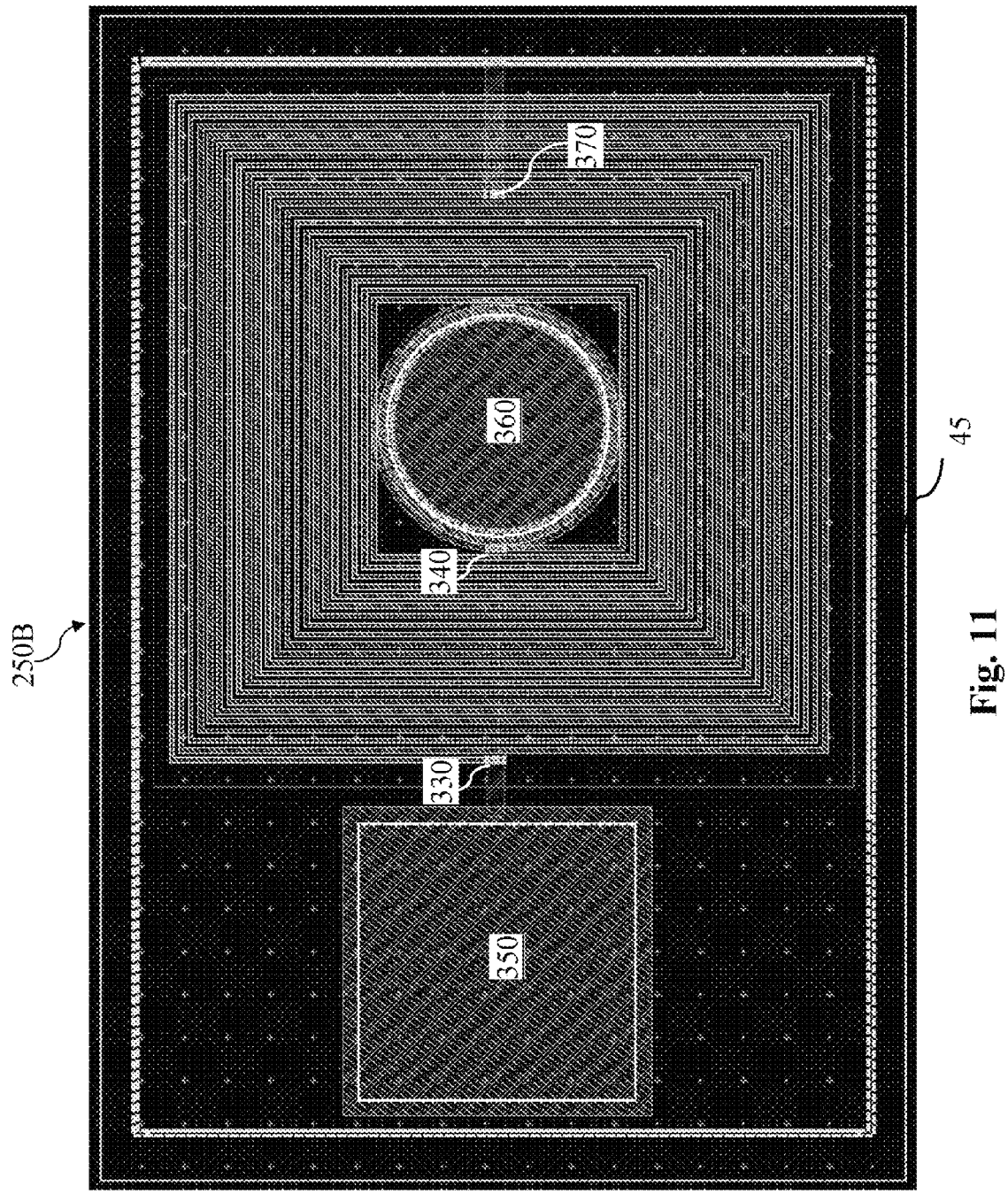

FIG. 11 illustrates another simplified top view of an embodiment of a resistor device 250B. The resistor device 250B is formed according to various aspects of the present disclosure discussed above. In this embodiment, the resistor device 250B has an elongated square shape. The resistor device 250B has two opposite distal ends 330 and 340. The distal ends 330 and 340 are electrically coupled to terminals 350 and 360, respectively. A high voltage may be applied to the terminal 350 while the terminal 360 is grounded, or vice versa. Thus, a high voltage potential exists across the resistor device 250B through the terminals 350 and 360. The resistor device 250B has a midpoint 370 that is equidistant (in terms of distance along the resistor 250B, rather than absolute distance between two points) from the two distal ends 330 and 340. According to the various aspects of the present disclosure, a high voltage N-well underneath the resistor device 250B may be electrically coupled to the midpoint 370, or close to it (for example within 10% of the total length of the resistor device 250B). For reasons similar to those discussed above with reference to FIG. 6, such configuration allows the resistor device 250B to have better breakdown performance.

Figure 12:
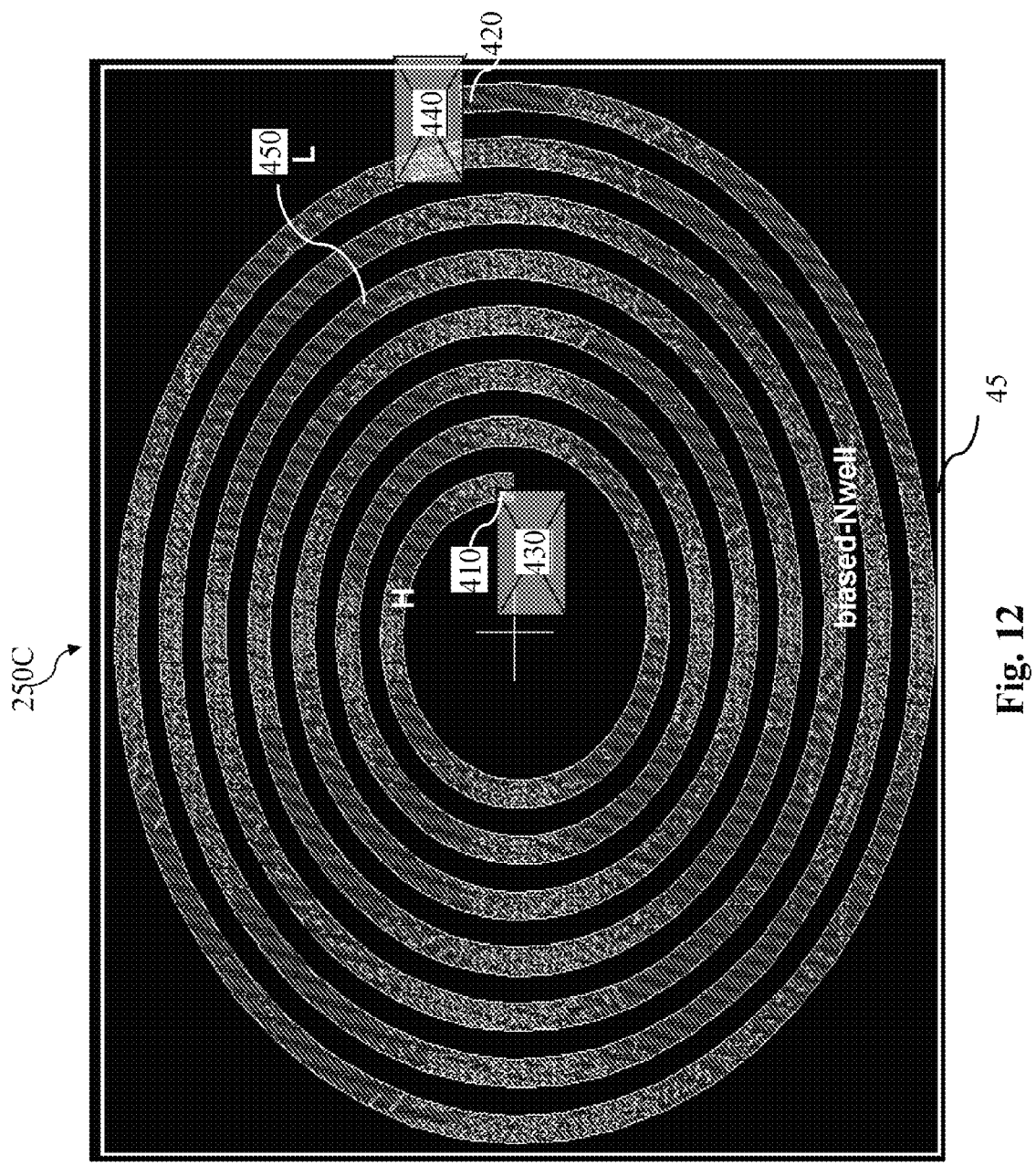

FIG. 12 illustrates another simplified top view of an embodiment of a resistor device 250C. The resistor device 250C is formed according to various aspects of the present disclosure discussed above. In this embodiment, the resistor device 250C has an elongated spiral shape. The resistor device 250C has two opposite distal ends 410 and 420. The distal ends 410 and 420 are electrically coupled to terminals 430 and 440, respectively. A high voltage may be applied to the terminal 430 while the terminal 440 is grounded, or vice versa. Thus, a high voltage potential exists across the resistor device 250C through the terminals 430 and 440. The resistor device 250C has a midpoint 450 that is equidistant (in terms of distance along the resistor 250C, rather than absolute distance between two points) from the two distal ends 410 and 420. According to the various aspects of the present disclosure, a high voltage N-well underneath the resistor device 250C may be electrically coupled to the midpoint 450, or close to it (for example within 10% of the total length of the resistor device 250C). For reasons similar to those discussed above with reference to FIG. 6, such configuration allows the resistor device 250C to have better breakdown performance.

Figure 13:
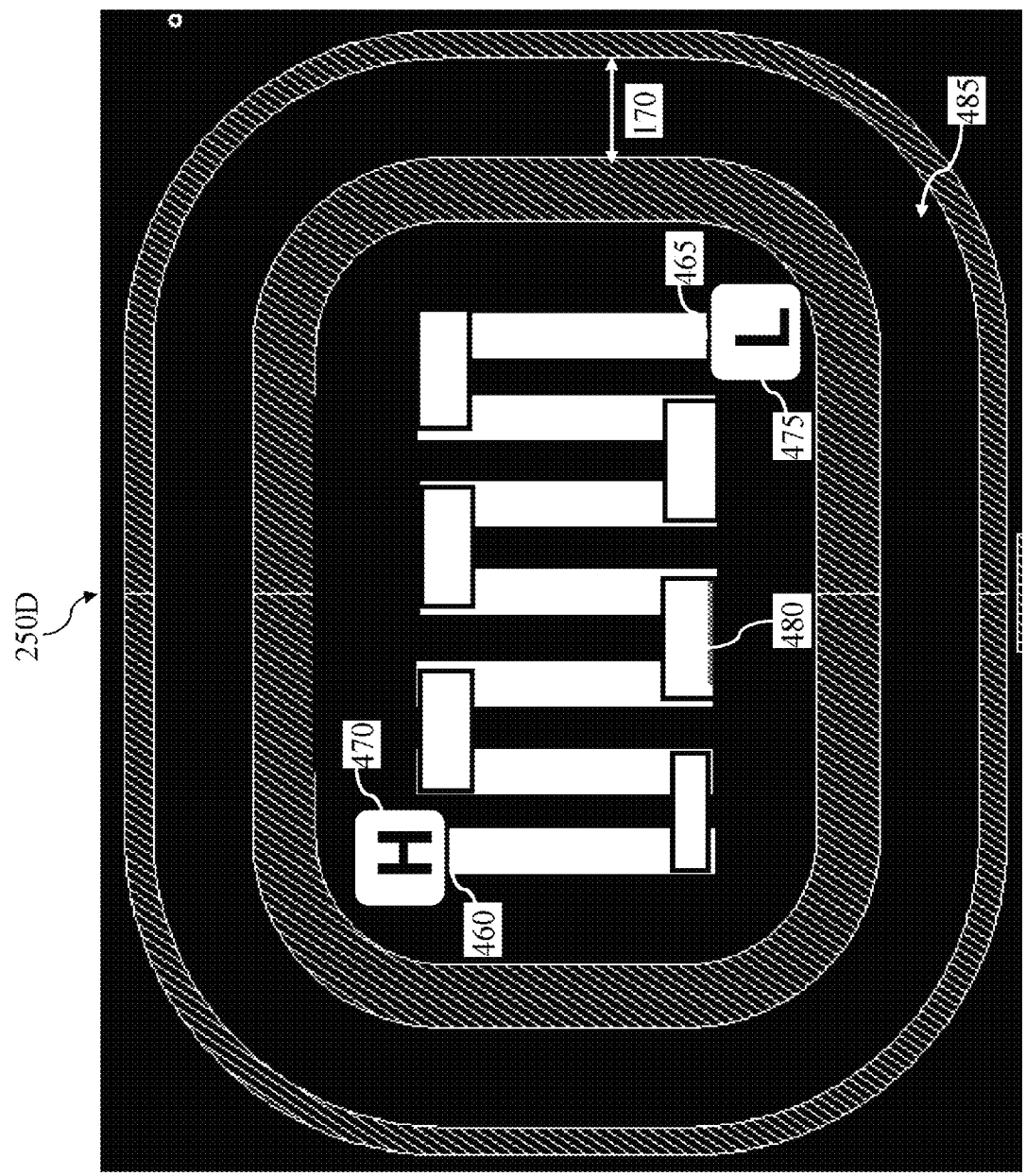

FIG. 13 illustrates another simplified top view of an embodiment of a resistor device 250D. The resistor device 250D is formed according to various aspects of the present disclosure discussed above. In this embodiment, the resistor device 250D has an elongated zig-zag shape, or an S-shape. The resistor device 250D has two opposite distal ends 460 and 465. The distal ends 460 and 465 are electrically coupled to terminals 470 and 475, respectively. A high voltage may be applied to the terminal 470 while the terminal 475 is grounded, or vice versa. Thus, a high voltage potential exists across the resistor device 250D through the terminals 470 and 475. The resistor device 250D has a midpoint 480 that is equidistant (in terms of distance along the resistor 250D, rather than absolute distance between two points) from the two distal ends 460 and 465. According to the various aspects of the present disclosure, a high voltage N-well underneath the resistor device 250D may be electrically coupled to the midpoint 480, or close to it (for example within 10% of the total length of the resistor device 250D). As discussed above, such configuration allows the resistor device 250D to have better breakdown performance—it can tolerate a higher voltage before breakdown occurs.

The resistor device 250D has a high-voltage junction ring 485. The high voltage junction ring 485 surrounds the elongated resistor device in the top view. The high voltage junction ring 485 includes a doped region. In an embodiment, the doped region is the epi-region 45 or the lightly-doped region 45 as discussed above. Thus, the high voltage junction ring 485 has a ring width 170 (also shown in FIG. 8), which is the width of the epi-region 45.

Figure 14:
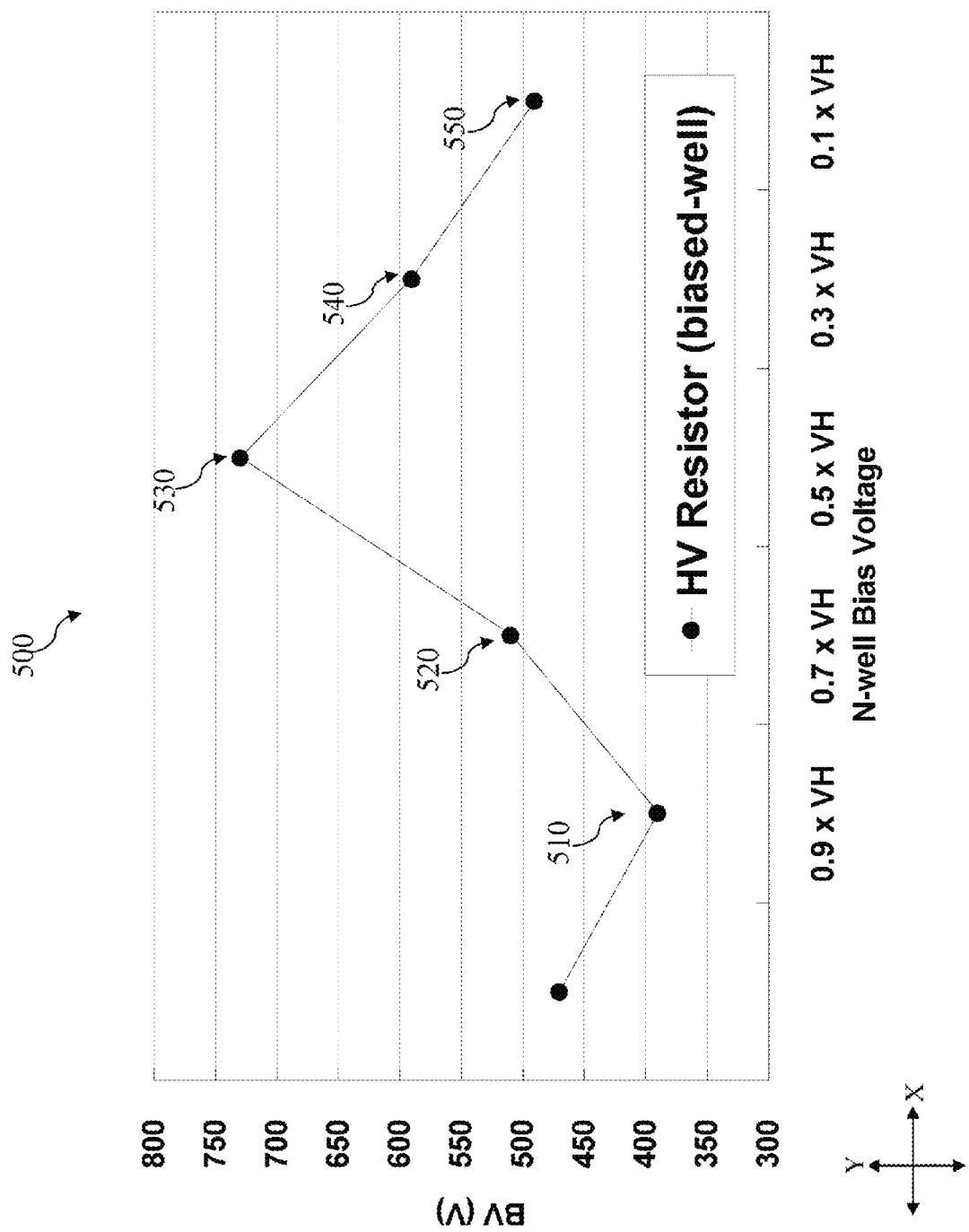
FIG. 14 is a chart illustrating a relationship between breakdown voltage VS electrical biasing voltage of a high voltage N-well according to various aspects of the present disclosure.

FIG. 14 is a chart 500 illustrating the relationship between breakdown voltage and the biased voltage of the high voltage N-well. An X-axis of the chart 500 represents the amount of bias voltage at the high voltage N-well below the resistor device. This bias voltage varies depending on where in the resistor device the high voltage N-well is tied to. A Y-axis of the chart 500 represents the breakdown voltage (BV). For example, at point 510, the high voltage N-well is tied to a point on the resistor device that is 0.1*L away from the high voltage distal end, where L=total length of the resistor device. Thus, the bias voltage of the N-well at point 510 is 0.9*VH, where VH=voltage difference applied across the resistor device. Since point 510 is relatively close to the distal end and not close to the midpoint of the resistor device, the breakdown voltage at point 510 is not optimal—slightly less than about 400 volts in this case.

Similarly, at point 520, the high voltage N-well is tied to a point on the resistor device that is 0.3*L away from the high voltage distal end, and the bias voltage of the N-well at point 520 is 0.7*VH. Since point 520 is closer to the midpoint of the resistor device than point 510, the breakdown voltage at point 520 is better—slightly greater than about 520 volts in this case even though it is still not optimal yet.

At point 530, the high voltage N-well is tied to approximately the midpoint of the resistor device, and the bias voltage of the N-well at point 530 is 0.5*VH. The breakdown voltage at point 530 is now substantially optimal and reaches about 730 volts.

At points 540 and 550, the high voltage N-well is tied to points on the resistor device that is 0.7*L away and 0.9*L away from the high voltage distal end (or 0.3*L away and 0.1*L away from the low voltage distal end), respectively. Thus, the bias voltage at points 540 and 550 are at 0.3*VH and 0.1*VH, respectively, and the breakdown performance of the resistor device at points 540 and 550 once again begin suffer. Thus, from the chart 500, it can be seen that the resistor device tends to reach optimal breakdown performance when the high voltage N-well is tied close to the midpoint of the resistor device.

Figure 15:
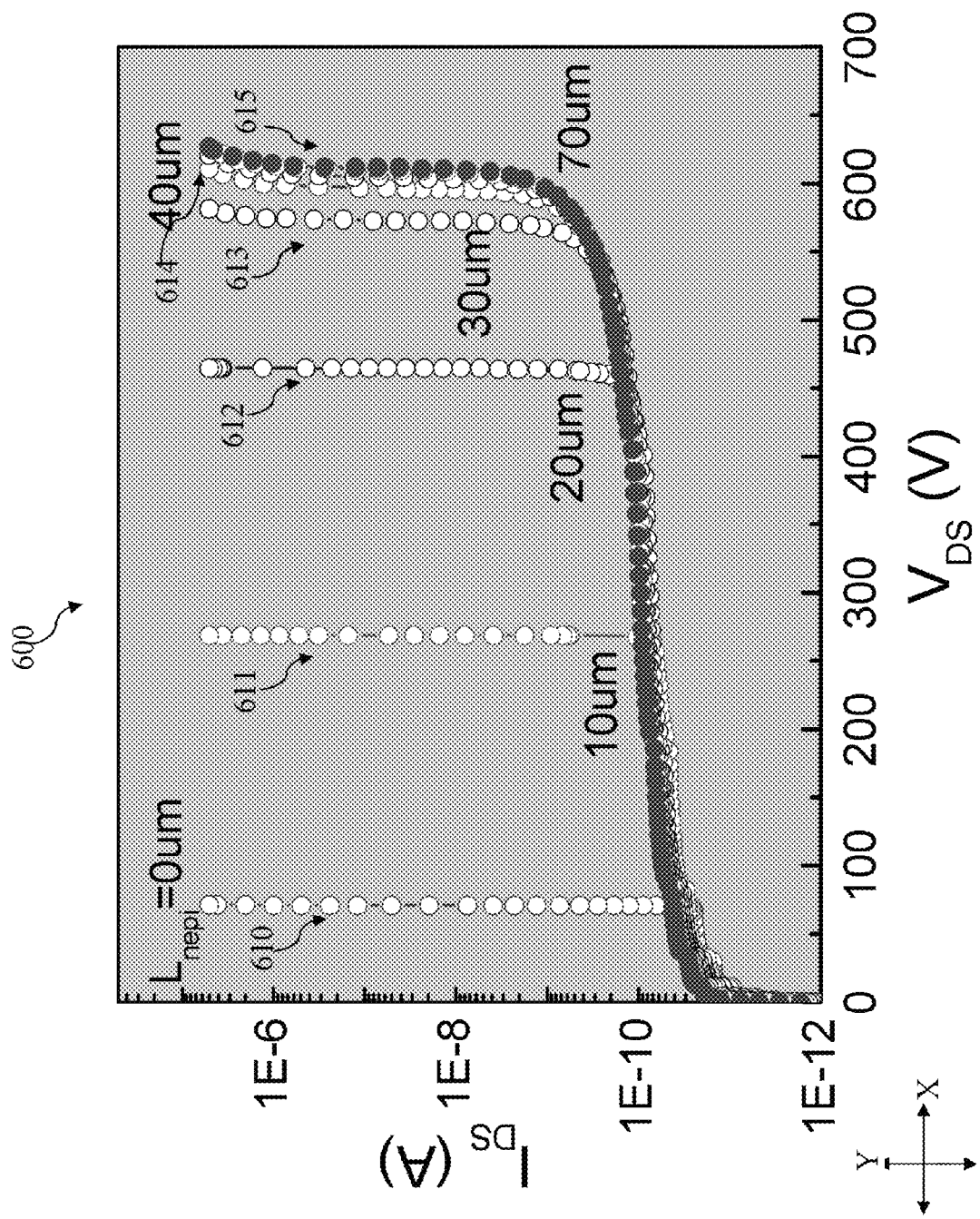
FIG. 15 is a chart illustrating a relationship between breakdown voltage VS width of a lightly-doped intrinsic region according to various aspects of the present disclosure.

FIG. 15 is a chart 600 illustrating the relationship between breakdown voltage and the width of the lightly-doped intrinsic region of the PIN diode discussed above. An X-axis of the chart 600 represents the source-to-drain voltage (Vds), which is also the voltage across the high-voltage resistor device discussed herein. The Y-axis of the chart 600 represents the source-to-drain current (Ids), which is also the current in the high-voltage resistor device discussed herein. If the resistor device is functioning properly, Vds and Ids should have a linear relationship, as Vds=Ids*R, where R is the resistance of the resistor device. However, if the resistor device has suffered a breakdown, then the relationship between Vds and Ids is no longer linear.

For example, the chart 600 contains a plurality of plot curves 610-615, each of which represents a simulation result of a Vds-Ids curve corresponding to a particular width of the lightly-doped intrinsic region of the PIN diode. For the plot curve 610, the width of the lightly-doped intrinsic region is approximately 0 um, meaning that the lightly-doped intrinsic region is substantially non-existent. As is illustrated, the resistor device associated with plot curve 610 experiences device breakdown—where Ids begins to "shoot" upward—when Vds is about 75 volts. This breakdown voltage may not satisfy many high voltage applications. For the plot curve 611, the width of the lightly-doped intrinsic region is approximately 10 um, and the resistor device associated with plot curve 611 experiences device breakdown when Vds is about 270 volts. For the plot curve 612, the width of the lightly-doped intrinsic region is approximately 20 um, and the resistor device associated with plot curve 612 experiences device breakdown when Vds is about 460 volts. For the plot curve 613, the width of the lightly-doped intrinsic region is approximately 30 um, and the resistor device associated with plot curve 613 experiences device breakdown when Vds is about 560 volts. For the plot curve 614, the width of the lightly-doped intrinsic region is approximately 40 um, and the resistor device associated with plot curve 614 experiences device breakdown when Vds is about 590 volts. For the plot curve 615, the width of the lightly-doped intrinsic region is approximately 70 um, and the resistor device associated with plot curve 615 experiences device breakdown when Vds is about 600 volts.

It can be seen that increasing the width of the lightly-doped intrinsic region (e.g., the epi-region 45 of FIG. 8) will increase the breakdown voltage of the resistor device. At some point, however, a saturation level may be reached, where increasing the width of the lightly-doped intrinsic region will not improve the breakdown voltage much. In the embodiment illustrated in FIG. 15, the saturation level occurs when the width of the lightly-doped intrinsic region is at a range from about 40 um to about 70 um. An optimum width may be chosen according to design and manufacturing concerns. For example, in an embodiment, such width may have a value that is large enough to offer a sufficient breakdown voltage but also small enough so as to not consume too much chip space.

The embodiments discussed above offer advantages over conventional high voltage devices, it being understood that different embodiments may offer different advantages, and that no particular advantage is required for all embodiments. One advantage is that through proper biasing of the high voltage N-well, the breakdown performance of the resistor device can be significantly improved. Another advantage is that the biasing of the high voltage N-well requires no extra fabrication processes and is compatible with existing process flow. Thus, the implementation of the embodiments discussed herein does not incur increased costs.

Another advantage is that, by incorporating a lightly-doped intrinsic region in between the P-well and the N-well, a PIN diode is formed. The PIN diode increases the breakdown voltage to at least as high as 600 volts. Furthermore, the N-well biasing discussed above can also in effect double the breakdown voltage (if the midpoint of the resistor is electrically coupled to the N-well). As such, the breakdown voltage can be increased to 1200 volts.

One of the broader forms of the present disclosure involves a semiconductor device that includes: a substrate; a first doped region disposed in the substrate; a second doped region disposed in the substrate, the second doped region being oppositely doped from the first doped region; a third doped region disposed in the substrate and between the first and second doped regions, the third doped region having a lower doping concentration level than both the first and second doped regions; an insulating device disposed over a portion of the first doped region; and a resistor disposed over the insulating device.

In an embodiment, the first, second, and third doped regions collectively form a PIN diode.

In an embodiment, the substrate is a P-type substrate; the first doped region includes an N-type doped well; the second doped region includes a P-type doped well; and the third doped region includes one of: a lightly-doped N-type intrinsic region and a lightly-doped P-type intrinsic region.

In an embodiment, the third doped region is a segment of an epi-layer.

In an embodiment, the third doped region has a width that is in a range from about 40 microns to about 70 microns.

In an embodiment, the resistor contains a polysilicon material; and the insulating device contains a dielectric material.

In an embodiment, the resistor is an elongate structure and has one of: a zig-zag shape, a square shape, and a spiral shape.

In an embodiment, the semiconductor device further includes an interconnect structure disposed over the resistor, the interconnect structure including: a first contact that is electrically coupled to the first doped region; a second contact that is electrically coupled to a portion of the resistor that is disposed between a first distal end and a second distal end of the resistor; and a conductive line that electrically couples the first and second contacts together.

In an embodiment, the portion of the resistor is located approximately at a midpoint of the resistor.

Another one of the broader forms of the present disclosure involves a semiconductor device that includes: a substrate; a PIN diode structure formed in the substrate, the PIN diode including an intrinsic region that is located between a first doped well and a second doped well, wherein the first and second doped wells having opposite doping polarities and each have a greater doping concentration level than the intrinsic region; an insulating structure formed over a portion of the first doped well; an elongate resistor device formed over the insulating structure, the resistor device having first and second portions disposed at opposite ends of the resistor device, respectively; and an interconnect structure formed over the resistor device, the interconnect structure including: a first contact that is electrically coupled to the first doped well; a second contact that is electrically coupled to a third portion of the resistor that is located between the first and second portions; and a conductive line that is electrically coupled to both the first contact and the second contact.

In an embodiment, the intrinsic region has a lateral dimension that is in a range from about 40 microns to about 70 microns.

In an embodiment, the resistor device contains a polysilicon material.

In an embodiment, the resistor device has one of: a zig-zag shape, a square shape, and a spiral shape.

In an embodiment, the third portion of the resistor device is located approximately at a midpoint of the resistor device.

Yet another one of the broader forms of the present disclosure involves a method of fabricating a semiconductor device. The method includes: forming an intrinsic region in a substrate; forming a first doped well in the substrate, the first doped region being formed adjacent to the intrinsic region and having a higher doping concentration level than the intrinsic region; forming a second doped well in the substrate, the second well being oppositely doped from the first doped well and having a higher doping concentration level than the intrinsic region, wherein the intrinsic region is disposed between the first and second doped wells; forming an isolation structure over the first doped well; and forming a resistor over the isolation structure.

In an embodiment, the forming the intrinsic region includes: performing an epitaxial process to form an epitaxial layer over the substrate; and patterning the epitaxial layer into a plurality of segments, one of the segments being the intrinsic region.

In an embodiment, the forming the intrinsic region is carried out using an ion implantation process.

In an embodiment, the forming the intrinsic region is carried out in a manner such that the intrinsic region has a lateral dimension that is in a range from about 40 microns to about 70 microns; and the intrinsic region and the first and second doped wells collectively constitute a PIN diode structure.

In an embodiment, the method further includes: forming an interconnect structure over the resistor, wherein the forming the interconnect structure includes: forming a first contact to be electrically coupled to the first doped well; forming a second contact to be electrically coupled to a segment of the resistor; and forming a conductive line to be electrically coupled to both the first and second contacts.

In an embodiment, the segment of the resistor is located near a midpoint of the resistor.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
    forming a PIN diode in a substrate, wherein the PIN diode includes a lightly-doped intrinsic region disposed between a heavily-doped first well and a heavily-doped second well, wherein the first well has a different type of conductivity than the second well, wherein the forming of the PIN diode comprises forming a buried well within the first well, the buried well and the first well having the same type of conductivity;
    forming a dielectric structure over a portion of the first well; and
    forming an elongate resistor over the dielectric structure.

2. The method of claim 1, wherein the forming of the PIN diode comprises:
    growing an epi-layer over the substrate via epitaxial growth; and
    forming the first well and the second well in different portions of the epi-layer via ion implantation;
    wherein the intrinsic region is formed by a remaining portion of the epi-layer disposed between the first well and the second well.

3. The method of claim 1, wherein the forming of the dielectric structure comprises forming field oxide as the dielectric structure.

4. The method of claim 1, wherein the forming of the dielectric structure is performed such that a segment of the dielectric structure is formed over the intrinsic region.

5. The method of claim 1, wherein the forming of the elongate resistor comprises forming a polysilicon resistor having one of the following shapes: a zig-zag shape, a square shape, and a spiral shape.

6. The method of claim 1, further comprising: electrically interconnecting the first well with a portion of the elongate resistor, wherein the portion of the resistor is located a predetermined distance away from a midpoint of the resistor, and wherein the predetermined distance is equal to about 10% of a total length of the resistor.

7. The method of claim 1, wherein the first doped well is formed before the second doped well.

8. A method of fabricating a semiconductor device, comprising:
- forming a buried well in a substrate, wherein the buried well has a first type of conductivity, and wherein the substrate has a second type of conductivity different from the first type of conductivity;
- growing an epi-layer over the substrate in an epitaxial growth process;
- forming a first doped well in the substrate and in a first portion of the epi-layer, the first doped well surrounding the buried well, wherein the first doped well has the first type of conductivity;
- forming a second doped well in the substrate and in a second portion of the epi-layer, wherein the second doped well has the second type of conductivity, and wherein a remaining portion of the epi-layer is disposed between the first doped well and the second doped well;
- forming an electrically insulating structure over the first doped well; and
- forming an electrically resistive structure over the electrically insulating structure.

9. The method of claim 8, the first doped well and the second doped well each have a higher doping concentration level than the epi-layer.

10. The method of claim 8, wherein the forming of the first doped well and the forming of the second doped well are each performed using an ion implantation process.

11. The method of claim 8, wherein the forming of the electrically insulating structure comprises forming a Local Oxidation of Silicon (LOCOS) structure as the electrically insulating structure.

12. The method of claim 8, wherein the forming of the electrically resistive structure comprises forming a polysilicon resistor as the electrically resistive structure.

13. The method of claim 12, wherein the polysilicon resistor is formed to be an elongate resistor and has one of the following shapes: a zig-zag shape, a square shape, and a spiral shape.

14. The method of claim 8, further comprising: forming an interconnect structure over the electrically resistive structure in a manner such that a middle segment of the electrically resistive structure is coupled to the first doped well.

15. A method of fabricating a high voltage semiconductor device, comprising:
- forming an intrinsic region in a substrate;
- forming a first doped well in the substrate, the first doped region being formed adjacent to the intrinsic region and having a higher doping concentration level than the intrinsic region;
- forming a buried well within the first doped well, the buried well and the first doped well having the same type of conductivity;
- forming a second doped well in the substrate, the second well being oppositely doped from the first doped well and having a higher doping concentration level than the intrinsic region, wherein the intrinsic region is disposed between the first doped well and the second doped well;
- forming an isolation structure over the first doped well; and
- forming a resistor over the isolation structure.

16. The method of claim 15, wherein the forming the intrinsic region includes: performing an epitaxial process to form an epitaxial layer over the substrate; and patterning the epitaxial layer into a plurality of segments, one of the segments being the intrinsic region.

17. The method of claim 15, wherein the forming the intrinsic region is carried out using an ion implantation process.

18. The method of claim 15, wherein: the forming the intrinsic region is carried out in a manner such that the intrinsic region has a lateral dimension that is in a range from about 40 microns to about 70 microns; and the intrinsic region and the first doped well and the second doped well collectively constitute a PIN diode structure.

19. The method of claim 15, further including: forming an interconnect structure over the resistor, wherein the forming the interconnect structure includes: forming a first contact to be electrically coupled to the first doped well; forming a second contact to be electrically coupled to a segment of the resistor; and forming a conductive line to be electrically coupled to both the first contact and the second contact.

20. The method of claim 19, wherein the segment of the resistor is located near a midpoint of the resistor.

\* \* \* \* \*